(12) United States Patent
Liao et al.

(10) Patent No.: US 6,727,719 B2
(45) Date of Patent: Apr. 27, 2004

(54) PIERCER COMBINED PROBER FOR CU INTERCONNECT WATER-LEVEL PRELIMINARY ELECTRICAL TEST

(75) Inventors: Yu-Ting Liao, Hsin-Chu (TW); Fu-Sung Liu, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/044,011

(22) Filed: Jan. 11, 2002

(65) Prior Publication Data

US 2003/0132772 A1 Jul. 17, 2003

(51) Int. Cl.[7] ............................................. G01R 1/073
(52) U.S. Cl. ....................................... 324/757; 324/761
(58) Field of Search .......................... 324/757, 754, 324/761, 762, 72.5

(56) References Cited

U.S. PATENT DOCUMENTS

| | | | |
|---|---|---|---|
| 5,225,037 A | * | 7/1993 | Elder et al. ................. 324/754 |
| 5,763,879 A | * | 6/1998 | Zimmer et al. ............. 324/757 |
| 5,926,029 A | * | 7/1999 | Ference et al. ............. 324/762 |
| 6,414,500 B1 | * | 7/2002 | Mizuta ........................ 324/754 |

\* cited by examiner

*Primary Examiner*—Ernest Karlsen
(74) *Attorney, Agent, or Firm*—Tung & Associates

(57) ABSTRACT

An apparatus and method for testing the electrical characteristics of a semiconductor wafer, including integrated circuit components thereof. An outer layer surrounds an inside needle, such that the outer layer comprises a hard material, which can penetrate through a semiconductor layer to permit subsequent testing of at least one semiconductor integrated circuit component located below the semiconductor layer. The inside needle may be adapted to electrically contact one or more electrical semiconductor circuit components located below the semiconductor layer. The inside needle generally comprises a prober, while the outer layer generally comprises a piercer. The outer layer may be configured from a hard material, such as diamond or carborundum. The inside needle and the outer layer together form a concentric double layer structure prober. The outer layer generally comprises a sheath formed from a hard dielectric material, such that the sheath comprises a piercer.

10 Claims, 1 Drawing Sheet

PIERCER COMBINED PROBER FOR CU INTERCONNECT WATER-LEVEL PRELIMINARY ELECTRICAL TEST

TECHNICAL FIELD

The present invention relates to methods and apparatus for the testing of semiconductor devices. Specifically, the present invention relates to apparatus and methods thereof, which facilitate the creation of a temporary electrical connection with semiconductor devices for the purpose of testing the functionality of the semiconductor devices. The present invention also relates to electrical prober devices and methods thereof.

BACKGROUND OF THE INVENTION

Usually in the field of manufacture of semiconductor devices, such as integrated circuits (ICs), and during one of the final stages of the manufacture, the electrical characteristics of semiconductor devices, called IC chips, formed on a silicon wafer or the like are examined. Such examination is normally effected prior to cutting the wafer to divide the same into respective IC chips. For the sake of such examination, an integrated-circuit tester, called an IC tester, and a probing apparatus, called a wafer prober, are used. The examination itself of the electrical characteristics of each of the IC chips is carried out actually by the IC tester, and the wafer prober is used in order to establish an electrical connection between the IC tester and each of the IC chips on the wafer.

Manufacturers of semiconductor products thus commonly test their products prior to shipping them to their customers. These tests are usually performed both at the wafer level ("wafer sort"), where the semiconductors are remain in the form in which they were manufactured, and at the package level ("package sort"), after the wafer has been sawn up and the individual chips have been mounted into their protective carriers. To perform these tests, a temporary, non-destructive electrical connection must be formed between the semiconductor device and the testing apparatus. The device used to perform this function at the wafer sort stage is generically known as a "wafer probe card". Thus generally, when the electrical characteristics of a wafer chip are tested, respective probes contact a plurality of microscopic electrode pads on a chip and the electrical test is performed through these probes.

Individuals with ordinary skill in the art will be familiar with various types of wafer probe cards and associated probers. Those skilled in the art are also familiar with the conventional assemblies utilized to interface, both mechanically and electrically, the semiconductor test computer's "test head" with an automated wafer prober in which a wafer probe card is positioned. The purpose of a test head is generally to place the high speed "test electronics" needed to test certain types of electronic devices as close as possible to the device-under-test (DUT). This shorter path greatly facilitates the passing of signals between the test electronics and the DUT. Wafer probers may be implemented as automated or manually controlled devices. A wafer prober may be configured as a conductive metal prober.

The physical relationship between the test head and the wafer prober has, historically, been problematic. The electrical connection between the test head and the wafer prober is generally a rigid member and a number of inventions have been created with the goal of forcing the test head and prober into an idealized physical relationship. Unfortunately, these rigid systems are generally either unwieldy or unsuccessful in their goal of forcing the test head and the prober into alignment. The result of this is a lack of reliable electrical contact between the test head and the probe card. Another undesirable result of this technique is warping of probe cards due to the forces induced on them either directly by the test head or by the Prober-Tester Interface (PTI).

Copper deposition manufacturing processes are gradually being adopted for deep sub-micron semiconductor manufacturing due its associated low resistance. A thin protecting silicon dioxide dielectric film is usually capped on inter-metal wafers to prevent copper degradation before electrical measurement. It is generally difficult for a conductive metal prober to pierce through the hard dielectric film of a semiconductor wafer requiring testing. Moreover, state-of-the-art prober tips are designed as round-shaped tips, resulting frequently in worn-out probers. Most importantly, a significant noise due to poor prober-to-bond-pad contact can cause inaccurate measurement results, even though metal probers successfully pierce through the protecting dielectric film.

Based on the foregoing, the present inventors have concluded that a need exists for an improved semiconductor wafer prober, which can overcome the aforementioned problems associated with prior art probers. The present inventors further realize that a need exists for a prober, which provides accurate and increasingly reliable electrical measurement data and a reduction in metal prober consumption.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an apparatus and method for testing the electrical characteristics of a semiconductor integrated circuit.

It another aspect of the present invention to provide an apparatus and method for piercing through a semiconductor layer to test electrical components configured below the semiconductor layer.

It is still another aspect of the present invention to provide a piercer, which is configured from a hard material, such as, for example, diamond or carborundum.

It is yet another aspect of the present invention to provide an apparatus and method for testing semiconductor wafers and integrated electrical components thereof based on a piercer combined with a prober.

It is still another aspect of the present invention to provide a cocentric double layer structure prober.

It is another aspect of the present invention to provide a piercer mounted as an outer layer surrounding an inner layer which functions as conductive metal prober.

It is also an aspect of the present invention to provide a dummy probe card, which can be installed with piercers made from a hard material such as, for example, diamond or carborundum.

It is yet an additional aspect of the present invention to provide a round tip metal probe, which can be utilized to measure electrical characteristics of a semiconductor wafer, including integrated circuit components thereof.

The above and other aspects of the present invention can thus be achieved as is now described. An apparatus and method for testing the electrical characteristics of a semiconductor integrated circuit are disclosed herein. In a first embodiment of the present invention, an outer layer surrounds an inside needle, such that the outer layer comprises a hard material, which can penetrate through a semiconductor layer to permit subsequent testing of at least one semiconductor integrated circuit component located below the semiconductor layer. The inside needle may be adapted to electrically contact one or more electrical semiconductor circuit components located below the semiconductor layer. The inside needle generally comprises a prober, while the outer layer generally comprises a piercer. The outer layer may be configured from a hard material, such as diamond or carborundum. The inside needle and the outer layer together form a concentric double layer structure prober. The outer layer generally comprises a sheath formed from a hard dielectric material, such that the sheath comprises a piercer.

In a second or alternative embodiment of the present invention, an apparatus for testing the electrical characteristics of a semiconductor integrated circuit can include a piercer comprising a hard material, wherein the piercer permits enhanced piercing of at least one semiconductor layer to thereby test at least one semiconductor integrated circuit component located below the semiconductor layer. Such an apparatus may also include a dummy probe card for establishing an electrical contact path between a conductive electrical prober thereof and one or more one semiconductor layers, thereby permitting subsequent electrical measurement of one or more semiconductor integrated circuit components located below such semiconductor layers. The conductive electrical prober may comprise a round tip metal probe, which can pierce through a Cu process path prior to Cu electrical interconnections thereof.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
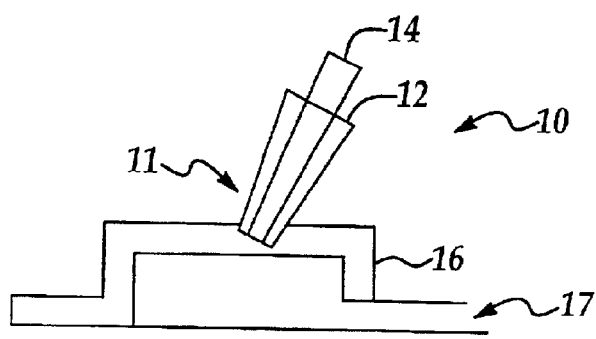
FIG. 1 illustrates a pictorial diagram of a piercer positioned above a test line pad during piercing, in accordance with a preferred embodiment of the present invention.
Figure 2:
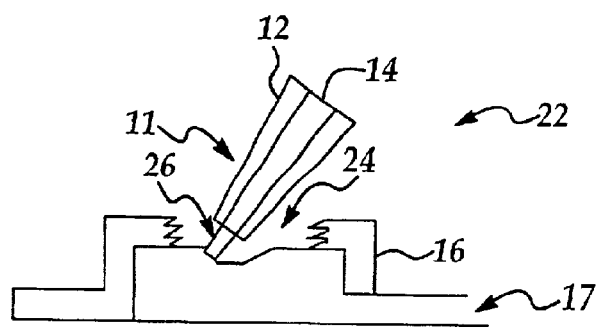
FIG. 2 depicts a pictorial diagram of a prober positioned above a broken oxide later as a result of piercing, in accordance with a preferred embodiment of the present invention.

FIG. 1 illustrates a pictorial diagram 10 of a piercer 11 positioned above a test line pad 16 during piercing, in accordance with a preferred embodiment of the present invention. FIG. 2 depicts a pictorial diagram 22 of 14 prober positioned above a broken oxide later 24 as a result of piercing, in accordance with a preferred embodiment of the present invention. Note that in FIG. 1 and FIG. 2, like parts are indicated by identical reference numerals. FIG. 1 thus reveals a configuration prior to piercing, while FIG. 2 reveals a configuration following piercing. FIG. 1 and FIG. 2 should be interpreted together in order to demonstrate probing and piercing functions, in accordance with a preferred embodiment of the present invention. FIG. 1 and FIG. 2 together illustrate a combined piercer/prober apparatus. Such a piercer/prober apparatus, which is depicted in FIG. 1 and FIG. 2, may be formed in a configuration similar to a ballpoint pent.

Piercer 11 generally comprises a dielectric sheath, which can be fabricated from a hard dielectric material mounted as an outer layer 12 that surrounds an inner needle (i.e., prober 14). Probe 14 comprises a conductive metal prober, which is formed from an inner layer or inner needle, as illustrated in FIG. 1. The hard dielectric sheath (i.e., piercer 11) thus acts as piercer. When metal prober 14 is drawn back, the outer dielectric sheath (i.e., piercer 11) can easily fabricate a cavity in the protecting SiO2 film 17 on the test line pad 16 of a semiconductor wafer. Test line pad 16 may be configured as a Cu (Copper) bond bad of the semiconductor wafer. As indicated in FIG. 1, metal prober may be pulled back. As illustrated thereafter in FIG. 2, metal prober 14 can be pushed down (i.e., protrusion) by a plunger, thereby jutting out, as indicated by reference numeral 26.

Compact kits may be installed for piercer-combined probes to control the inner metal material protrusion or retreation. When the inner metal prober 14 juts out, as indicated by reference numeral 26 of FIG. 2, a perfect contact can thus be provided, ensuring accurate measurement results. Additionally, metal prober protrusion or retreation without a prober position moving can guarantee no double testing markers, and the piercing through Cu process thus functions properly. Note that a Cu test pad may be used only with a Cu wafer. Also, the angle deployment of the prober/piercer, as illustrated in FIG. 1 and FIG. 2 may be adjusted.

Figure 3:
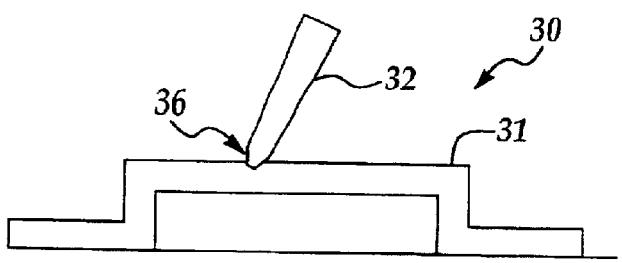
FIG. 3 illustrates a round tip metal probe, in accordance with an alternative embodiment of the present invention.
Figure 4:
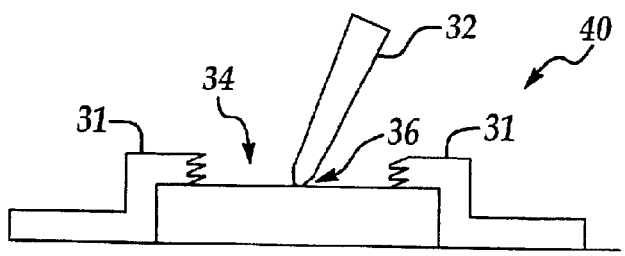
FIG. 4 depicts a round tip metal probe as a result of piercing, in accordance with an alternative embodiment of the present invention.

FIG. 3 illustrates a pictorial diagram 30 illustrative of a round tip metal prober 32, in accordance with an alternative embodiment of the present invention. FIG. 4 depicts a pictorial diagram 40 illustrating round tip metal prober 32 following piercing of a bond pad 31, in accordance with an alternative embodiment of the present invention. In FIG. 3 and FIG. 4, like parts are indicated by identical reference numerals. As indicated in FIG. 3, the round tipped metal prober 32 through a thin $SiO_2$ film on bond pad 32 generally results in bad measurements. Thus, the original testing condition results in piercing difficulties.

Round tip metal prober 32 thus comprises a round tip 36. In accordance with an alternative embodiment of the present invention, a dummy probe card may be installed with piercers, which are generally formed from a hard material, such as, for example, diamond or carborundum. The bond pad 31 can be pierced by the dummy probe card to fabricate a good contact path, as illustrated in FIG. 4. Thereafter, normal wafer electrical measurements can be performed by a normal probe card. A small unit may be equipped to pierce through a thin $SiO_2$ film on bond pad 32 and make a good contact path. Cu interconnect semiconductor wafers can then be sent to wafer acceptance tests to perform preliminary electrical measurements.

Note that after the completion of the manufacturing process of an integrated circuit, the circuits fabricated on a semiconductor wafer are normally tested using a multiplepoint probe card. A normal probe card is typically configured as a printed circuit board that can be used in conjunction with testing equipment to test the electrical properties of semiconductor chip devices. A typical probe card contains a plurality of probe needles. During the testing procedure, the probe needle is brought into contact (a touchdown) with the bonding pad of the test key, located on the individual circuit.

The probe needles are typically applied to the test key of the wafer with sufficient force to ensure a proper contact with the bonding pad. As a result, the probe needle scratches the surface of the bonding pad, and the scratch mark on the bonding pad are used to evaluate the quality of the test. When a scratch mark is too big, the vertical position or the height of the probe needle is adjusted to maintain the quality of the test. As described herein, in accordance with an alternative embodiment of the present invention, however, a dummy probe card is initially utilized rather than a normal or typical probe card. Such a dummy probe card can be installed with piercers made of a hard material. The dummy probe card is utilized to pierce the bond pad (i.e., bonding pad) to fabricate a good electrical contact path.

Based on the foregoing it can be appreciated that the present invention discloses an apparatus and method for testing the electrical characteristics of a semiconductor integrated circuit are disclosed herein. In a first embodiment of the present invention, an outer layer generally surrounds an inside needle, such that the outer layer comprises a hard material, which can penetrate through a semiconductor layer to permit subsequent testing of at least one semiconductor integrated circuit component located below the semiconductor layer.

The inside needle may be adapted to electrically contact one or more electrical semiconductor circuit components located below the semiconductor layer. The inside needle generally comprises a prober, while the outer layer generally comprises a piercer. The outer layer may be configured from a hard material, such as diamond or carborundum. The inside needle and the outer layer together form a concentric double layer structure prober. The outer layer generally comprises a sheath formed from a hard dielectric material, such that the sheath comprises a piercer.

It can also be appreciated, based on the foregoing that in a second or alternative embodiment of the present invention, an apparatus for testing the electrical characteristics of a semiconductor integrated circuit can include a piercer comprising a hard material. Such a piercer permits enhanced piercing of at least one semiconductor layer to thereby test at least one semiconductor integrated circuit component located below the semiconductor layer.

Such an apparatus may also include a dummy probe card for establishing an electrical contact path between a conductive electrical prober thereof and one or more one semiconductor layers, thereby permitting subsequent electrical measurement of one or more semiconductor integrated circuit components located below such semiconductor layers. The conductive electrical prober may comprise a round tip metal probe, which can pierce through a Cu process path prior to Cu electrical interconnections thereof.

Additionally, based on the foregoing, it can be appreciated that a number of advantages and features can be realized in accordance with implementations of the present invention. For example, more accurate and more reliable electrical measurements can be obtained. Additionally, the present invention solves the "double market problem," well-known by those skilled in the art, thereby perfecting electrical contacts and guaranteeing précised measured results. Additionally, metal prober consumption can be effectively reduced.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. An apparatus for testing the electrical characteristics of a semiconductor integrated circuit, said apparatus comprising:

an outer layer surrounding an inside needle, which can be drawn back and then released for subsequent probing and testing operations by said inside needle; and said outer layer comprising a hard dielectric material, which can penetrate through a semiconductor layer to permit subsequent testing of at least one semiconductor integrated circuit component located below said semiconductor layer.

2. The apparatus of claim 1 wherein said inside needle is adapted to electrically contact said at least one semiconductor integrated circuit component located below said semiconductor layer.

3. The apparatus of claim 1 wherein said inside needle comprises a metal prober.

4. The apparatus of claim 1 wherein said outer layer comprises a piercer in a shape of hard dielectric sheath.

5. The apparatus of claim 1 wherein said outer layer comprises diamond.

6. The apparatus of claim 3 wherein said metal prober comprises a conductive metal.

7. The apparatus of claim 1 wherein said inside needle and said outer layer together form a concentric double layer structure prober.

8. The apparatus of claim 1 wherein said outer layer comprises a sheath formed from a hard dielectric material, such that said sheath comprises a piercer.

9. A combined piercer/prober apparatus for testing the electrical characteristics of a semiconductor integrated circuit, said apparatus comprising:

a piercer in a shape of a hard dielectric sheath comprising an outer layer;

a prober formed from an inner layer in a shape of an inside needle surrounded by said outer layer, wherein said prober can be drawn back while said piercer penetrates at least one semiconductor integrated circuit located below said semiconductor layer for subsequent probing and testing thereof by said prober and wherein said inside needle is adapted to electrically contact said at least one semiconductor integrated circuit component located below said semiconductor layer; and wherein said piercer and said prober together comprise a combined piercer/prober pen-shaped apparatus for testing the electrical characteristics of said at least one semiconductor integrated circuit.

10. A combined piercer/prober apparatus for testing the electrical characteristics of a semiconductor integrated circuit, said apparatus comprising:

a piercer in a shape of a hard dielectric sheath comprising an outer layer surrounding an inner layer in a shape of an inside needle;

a prober formed from and comprising said inner layer wherein said prober can be drawn back while said piercer penetrates at least one semiconductor integrated circuit located below said semiconductor layer for subsequent probing and testing thereof by said prober;

wherein said inside needle and said outer layer together form a concentric double layer structure prober and wherein said inside needle is adapted to electrically contact said at least one semiconductor integrated circuit component located below said semiconductor layer; and wherein said piercer and said prober together comprise a combined piercer/prober pen-shaped apparatus for testing the electrical characteristics of said at least semiconductor integrated circuit.

* * * * *